United States Patent [19]

Itani et al.

[11] Patent Number: 4,680,533

[45] Date of Patent: Jul. 14, 1987

[54] PROTECTION ARRANGEMENT FOR SWITCHING DEVICE OF A CAPACITIVE LOAD PULSER CIRCUIT

[75] Inventors: Abdallah M. Itani, Ballston Spa; Gerald J. Carlson, Scotia; Peter W. Dietz, Greenwich, all of N.Y.

[73] Assignee: General Electric Company, Schenectady, N.Y.

[21] Appl. No.: 761,459

[22] Filed: Aug. 1, 1985

[51] Int. Cl.[4] .............................................. B03C 3/01
[52] U.S. Cl. .................................. 323/240; 361/235; 55/139
[58] Field of Search ............... 363/51, 54, 57; 55/139, 55/103; 323/273, 276, 240, 903; 361/2, 235, 91; 307/252 M, 252 J, 108

[56] References Cited

U.S. PATENT DOCUMENTS

| | | | |
|---|---|---|---|
| 3,374,609 | 3/1966 | Kide | 55/105 |
| 3,648,437 | 3/1972 | Bridges | 55/105 |
| 3,783,305 | 1/1974 | Lefferts | 307/136 |
| 3,842,337 | 10/1974 | Ekstrom et al. | 321/27 |
| 3,894,269 | 7/1975 | Ahrens | 315/379 |
| 4,077,377 | 3/1978 | Jundt et al. | 123/148 |
| 4,084,206 | 4/1978 | Leowald et al. | 361/90 |
| 4,237,509 | 12/1980 | Asplund | 361/56 |
| 4,377,835 | 3/1983 | Asplund et al. | 361/91 |
| 4,390,831 | 6/1983 | Byrd et al. | 323/240 |
| 4,445,911 | 5/1984 | Lind | 55/2 |
| 4,503,477 | 3/1985 | Henriksen et al. | 361/2 |
| 4,522,635 | 6/1985 | Matts | 55/2 |

FOREIGN PATENT DOCUMENTS 0103950 3/1984 European Pat. Off.
01452211 4/1985 European Pat. Off.

OTHER PUBLICATIONS

Article—"Energy Conserving Pulse Energization of Precipitators", P. Lausen, H. Henriksen, H. Hoegh Peterson—1979 IEEE-1AS79:6B, pp. 163-171.

Primary Examiner—L. T. Hix
Assistant Examiner—D. Rutledge
Attorney, Agent, or Firm—Bernard J. Lacomis; James C. Davis, Jr.

[57] ABSTRACT

A method and apparatus for protecting switching elements, and in particular, thyristor switching elements, which are used to supply pulses to a capacitive load, from damage resulting from sparkover occurring in that load are described. The load voltage pulse is characterized by a period of rising voltage followed by a period of falling voltage, these two periods being separated by a transition period of maximum vulnerability of the switching element to damage from sparkover. Specifically, during this period of maximum vulnerability of the switching elments to damage, a gate trigger pulse is applied to the elements to cause them to resume a conductive state, independent of the occurrence of an abnormal sparkover condition.

19 Claims, 4 Drawing Figures

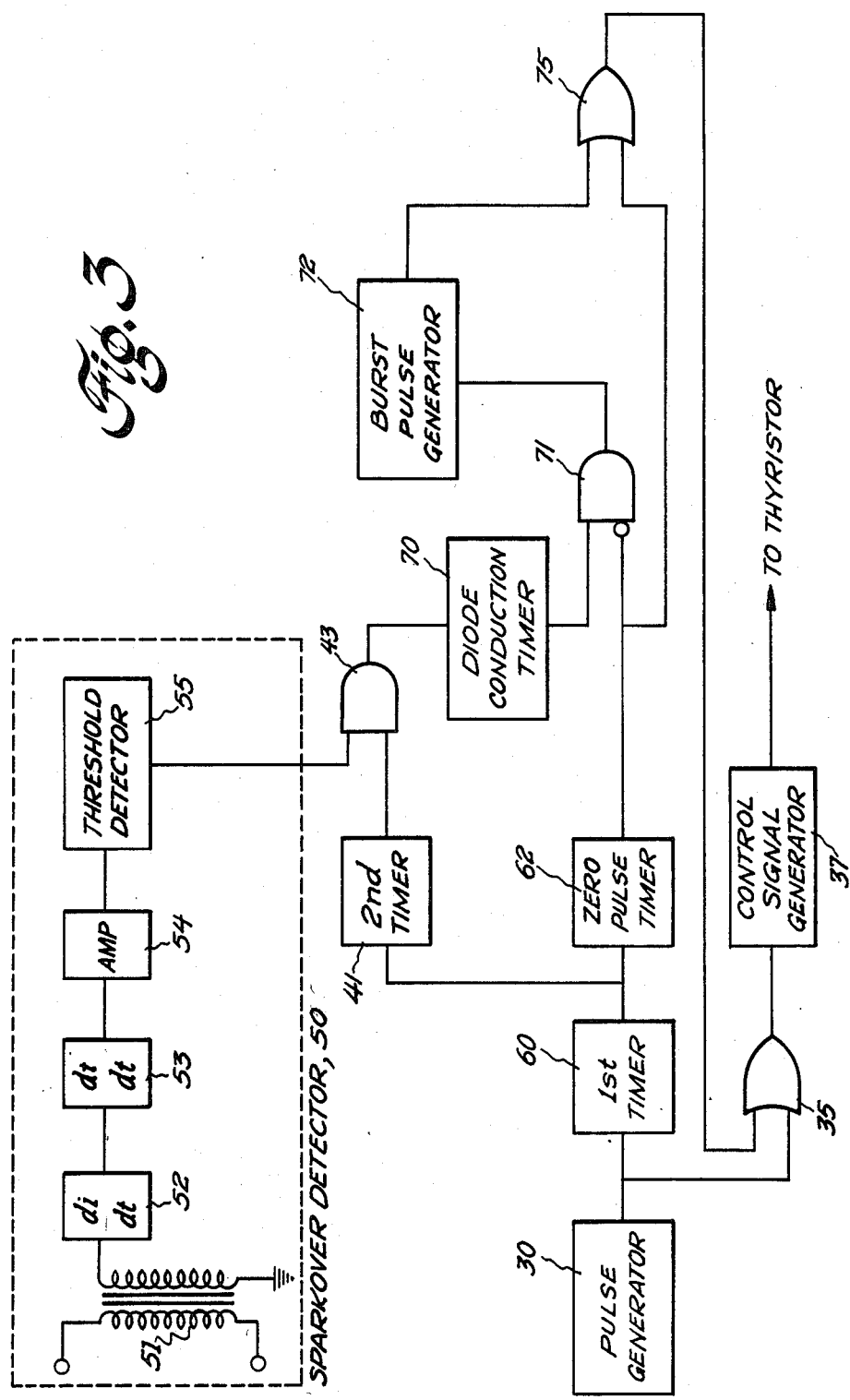

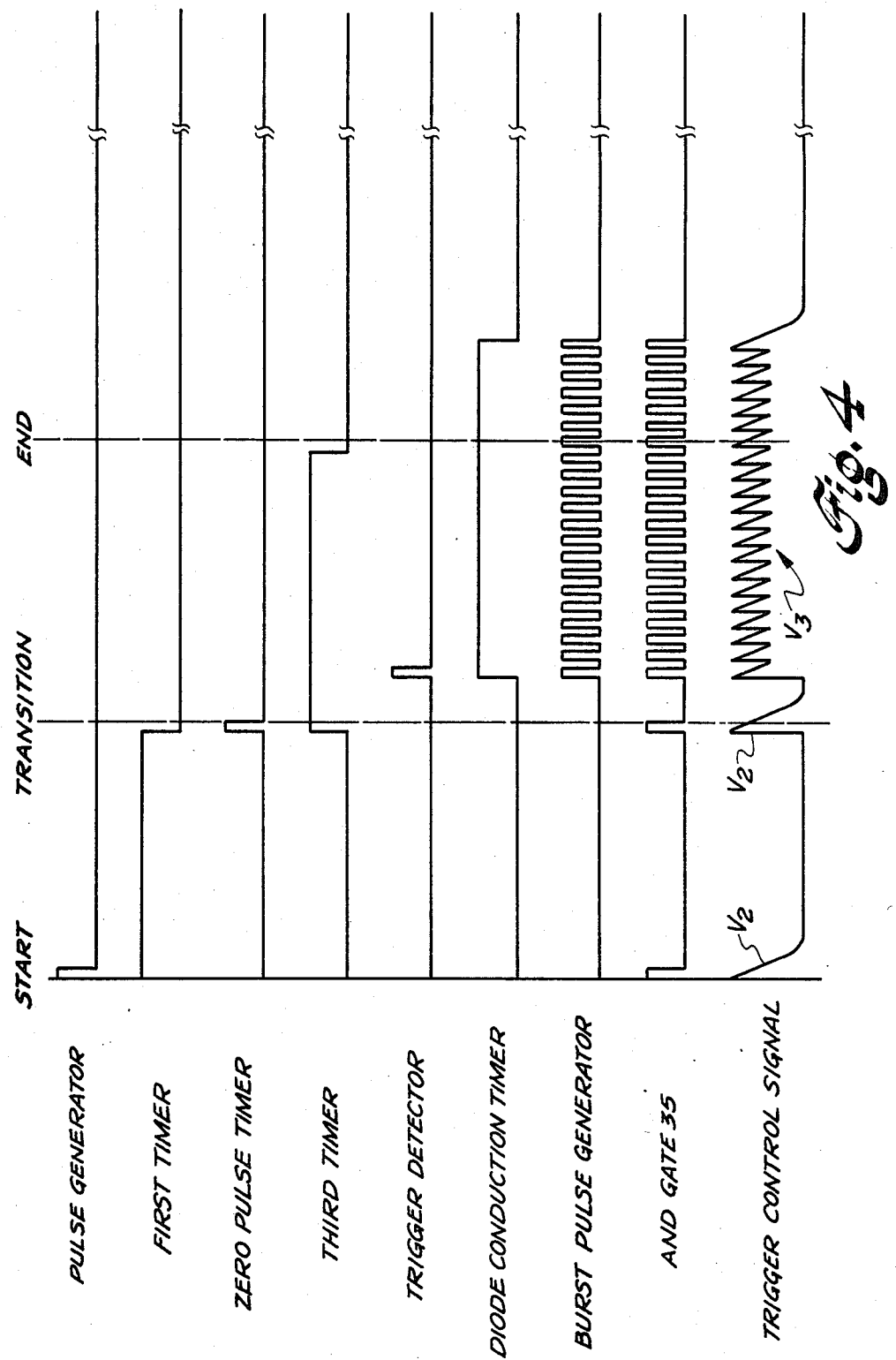

PROTECTION ARRANGEMENT FOR SWITCHING DEVICE OF A CAPACITIVE LOAD PULSER CIRCUIT

BACKGROUND OF THE INVENTION

This invention relates to circuits for generating pulses across capacitive loads by means of a gated semiconductor switching device. More specifically, it is directed to a pulser circuit of the above noted type which is used to energize an electrostatic precipitator and which uses a thyristor or similar semiconductive switching element as part of the pulse generating circuit.

Electrostatic precipitators are electrical devices employed to remove particulate matter from a gaseous stream directed between oppositely charged precipitator electrodes. Precipitators are used in a number of industrial applications including chemical plants, and more particularly, including electric power plants and other potential sources of particulate solution. Recently electrostatic precipitators have been much more frequently employed than in the past because of the increased needs and desires for a particulate removal from gases vented to the atmosphere. It should also be appreciated that the electrostatic precipitators of primary concern herein are high energy devices typically consuming several tens of kilowatts of electrical energy. Accordingly, proper precipitator energization is important, not only with respect to particle collection, efficiency, but also with respect to economy and reliability of precipitator operation.

Many precipitator designs have been employed in the past. However, each basically operates upon fairly well established principles. Precipitators generally include a pair of conductive electrodes. Typically, one of the electrodes comprises parallel plain metallic sheets spaced a relatively small preselected distance apart which are operated at ground potential. Additionally, a planar array of wires, connected electrically together and disposed midway between and parallel to the conductive sheets, comprises the second electrode. This planar array is maintained at high electric potential. While it is possible to ground the wire electrodes and apply high potential voltage to the electrode sheets, this mode of operation is typically avoided for safety reasons. A number of the parallel plate electrodes are assembled in a housing which defines a plurality of parallel gas flow passages to the volume between the precipitator electrodes. These passages are also defined, at least in part, by the structure and arrangement of plate electrodes. In general, commercial precipitators employ a plurality of plate and wire grid electrode pairs. The area of a typical section of a precipitator may, in fact, possess up to about 30,000 square feet of plate electrode area. Naturally, such a configuration exhibits a certain amount of electrical capacitance between the wire and the plate electrodes. The capacitance of a typical precipitator section is on the order of between 0.05 to 0.15 microfarads. While the operation of such precipitators appears to be relatively simple, there are several phenomenon which occur, which can limit precipitator particle collection efficiency. Different methods of energizing precipitators significantly effect the amount of electrical energy and power expended in removing a given fraction of particles from a gas stream in a given precipitator and with a given type of particle. It should be pointed out that precipitators generally operate at peak voltages of between 40,000 and 80,000 volts and each section may draw a current of about 1.5 amperes. It is thus easily seen that precipitator power levels of 80 kilowatts are not uncommon.

Therefore, electrical efficiency is a significant economic factor in plants employing electrostatic precipitators for the removal of particulate matter. Furthermore, for continuous plant operation, reliability of the precipitator and precipitator energizing components is very important. In normal operation, particulate matter in the gas to be treated acquires a negative charge as the result of induced ionization effects occurring principally in the vicinity of the precipitator cathode wires. The charged dust particles are then attracted to the precipitator anode plates where a layer of anode dust accumulates. As this dust layer accumulates, an increasingly thick dust layer is formed on the plate (that is, sheet) electrode. Even though the dust layer may be periodically removed by means of vibrating, wrapping, or otherwise flexing the anode plates, there is still an efficiency reduction concomitant with the formation of this highly resistive layer. Accordingly, efficient yet effective economical ways of energizing precipitators are highly desirable, particularly for the collection of dust particles exhibiting high resistivity, that is a resistivity of about $10^{-11}$ ohm-cm, or higher. For example, such dusts are created in the burning of low sulphur coal used by the electric utility industry.

The design and operation of electrical circuits for precipitators energization has taken many different paths in hope of arriving at a method of precipitator operation which is efficient, reliable, controllable and relatively inexpensive to implement. Furthermore, there has not been broad agreement amongst the practitioners in this art with respect to optimal precipitator energization methods. Of late, various pulse energization methods have come into broad use. An inherent problem in using pulse energy to drive a large capacitive load, as is typically presented by large capacitive precipitators, is that a considerable amount of energy is required to repetitively charge the load capacitance to a high voltage level. Since the capacitive load dissipates relatively little energy as a result of each applied pulse, recovery of the remaining energy stored in the load, and not consumed by for example, corona discharge or arcing, is of prime economic importance. Inverter circuits for accomplishing the above typically use a thyristor shunted by a feedback diode, the diode being connected in inverse parallel relationship across the thyristor. The diode is needed to carry reactive energy to the supply during some portion of the operating period. The current flowing through the capacitive load as a result of using such an arrangement takes on a generally sinusoidal waveshape. A cycle is initiated by triggering of the thyristor which conducts for the first half of the sinusoid, current through the thyristor rising to a peak and then falling to zero at the time voltage in the load reaches its peak value. During the second half of the sinusoid, current through the thyristor is cut off and the device is substantially in a nonconductive state while the diode shunts current around the thyristor in a direction opposite that which it flowed during the first half of the sinusoid. After diode conduction ceases, the thyristor must be capable of blocking a high applied forward voltage until the arrival of the next trigger pulse on its control electrode to begin a new cycle of operation.

During the operation of such capacitive loads, such as electrostatic precipitators, sparkovers can occur from time to time. A sparkover is any momentary low impedence condition in the secondary of the load transformer such as a sudden electrical arc or an electrical short created across the load terminals. Such sparkovers can occur during both the rise of the applied voltage pulse across the precipitator and during the decay of that pulse. If a sparkover occurs during the time when the current is flowing through the diode (the decay of the voltage pulse across the load), a rapid decrease in current leading rapidly to current reversal through the diode occurs, followed by a rapid rise in forward voltage across the thyristor. If such change in forward voltage across the thyristor occurs during its forward recovery or turn-off time, hereinafter designated as $t_q$, i.e., when the thyristor is not capable of blocking such forward voltage, the thyristor will be forced to conduct under circumstances which may damage or destroy it. Specifically, if a thyristor is forced into conduction during the time when there is insufficient gate current to provide a sufficiently large conducting channel through the device, the result is a weak turn-on, i.e., a large current flow through a relatively narrow conducting channel resulting in overheating and potential destruction of the device.

One method for protecting a thyristor switch in an electrostatic precipitator under such circumstances is described in U.S. Pat. No. 4,503,477 wherein it is suggested that a thyristor switch element within a pulse generator supplying a capacitive load may be protected against damage during sparkover which occurs in the load by triggering the thyristor immediately after the sparkover occurs. According to this prior art teaching, the thyristor is triggered into conduction if the slope of the voltage across the load exceeds a preset positive value during a period of pulse decay. Also, this patent describes another alternative for detecting sparkover by sensing the pulse current, which consists of a negative half-period and a positive half-period, and triggering the thyristor to conduction when a shift to negative occurs during the normally positive half-period. Significantly, for both methods disclosed in the above noted patent, it is noted that firing of the semiconductor device into a conductive state after sparkover should take place within 15 microseconds, preferably in less than 2 microseconds.

It has been found, however, that failure can still occur during particular times in the pulser cycle even if firing the SCR to conduction is accomplished within a period of less than 1 microsecond, and this is mainly due to the uncertainty of the device characteristics during the abovenoted $t_q$ time interval. The need for a short time interval for switching the thyristor into a conductive state is especially critical at the time of transition from thyristor conduction to diode conduction. This transition coincides with the peak voltage across the load and the beginning of the decay from this peak.

In the usual operation of a pulsed electrostatic precipitator incorporating a technique for protecting the thyristor similar to that suggested in U.S. Pat. No. 4,505,477, the thyristor is, nevertheless, particularly vulnerable to such potential damage at several times during the operating cycle. Firstly, it is particularly vulnerable to sparkover damage near the peak of the voltage applied across the precipitator electrode (near the transition between thyristor conduction and shunting diode conduction) since at this time the value of applied forward voltage impressed across the thyristor switch as a result of a sparkover is at a maximum. In addition, since current has not yet begun to flow in great magnitude through the shunting diode, and the thyristor has not yet regained its forward blocking capability, current through the thyristor increases rapidly in response to this applied positive forward voltage. It is difficult to react to a sparkover in a sufficiently short time to protect the thyristor from weak turn-on under such conditions. The vulnerability of the switching element of a pulser circuit during the time period occurring near the peak precipitator voltage is specifically addressed in this application. The disclosed technique guarantees firing of the SCR to protect it from damage as a result of sparkover occurring near the above noted transition by insuring that a strong firing gate pulse is always present during the time the thyristor is within this transition period, i.e., near peak load voltage or the transition from thyristor conduction to diode conduction. independent of the detection of a sparkover.

Another point of vulnerability in such pulser systems is near the end of a pulser cycle when forward voltage rises sharply across the thyristor during normal operation, i.e., operation without sparkover. If the thyristor is still in its $t_q$ or turn-off time period at this time, the ensuing weak turn-on will damage the thyristor. In systems of the type disclosed in aforementioned U.S. Pat. No. 4,505,477, there is a possibility that a trigger pulse will be falsely sent to the thyristor gate so near to the end of the cycle (when forward voltage returns) that charge in the thyristor gate has sufficient time to diminish to a level such that a weak turn-on is initiated by the return of forward voltage. False triggers may be the result of electrical noise or signals coupled from adjacent circuits. This problem due to false triggering is the subject of concurrently filed commonly assigned, application Ser. No. 761,458 in the name of the same inventors.

OBJECTS AND SUMMARY OF THE INVENTION

It is, therefore, a primary object of the invention to protect switching elements and in, particular, thyristor switching elements used in pulse generators which supply electrical voltage pulses to a capacitive load, from damage resulting from sparkover occurring in that load.

It is another object of the invention to provide a method and arrangement for protecting such switching elements from damage due to excessive current density as a result of sparkover which occurs during the time when those switching elements are recovering their voltage blocking capability, but which is independent of the need for detecting the actual sparkover and responding to such sparkover.

A yet further object of the invention is to provides a means for maintaining the semiconductor switching element used in a pulser circuit for supplying a capacitive load in a conductive state during the critical turn-off time period when the device is recovering its voltage blocking capability immediately adjacent the instant of transition from thyristor conduction to diode conduction (at and near peak load voltage), and during which it is most difficult to protect from damage as a result of sparkover.

These and other objects of the invention are achieved by providing a strong gating trigger pulse to the semiconductor device used in a pulser circuit for supplying a capacitive load adjacent the transition from thyristor conduction to shunt diode conduction when the device is most difficult to protect from damage due to sparkover and independent of an actual detection of such sparkover.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 3 shows, in block diagram form, a circuit which incorporates the teachings of the invention for controlling the firing of the thyristor switch in the circuit of FIG. 1; and FIG. 4 is a graph illustrating the timing of various signals in the circuit according to the invention.

DETAILED DESCRIPTION OF THE INVENTION

Figure 1:
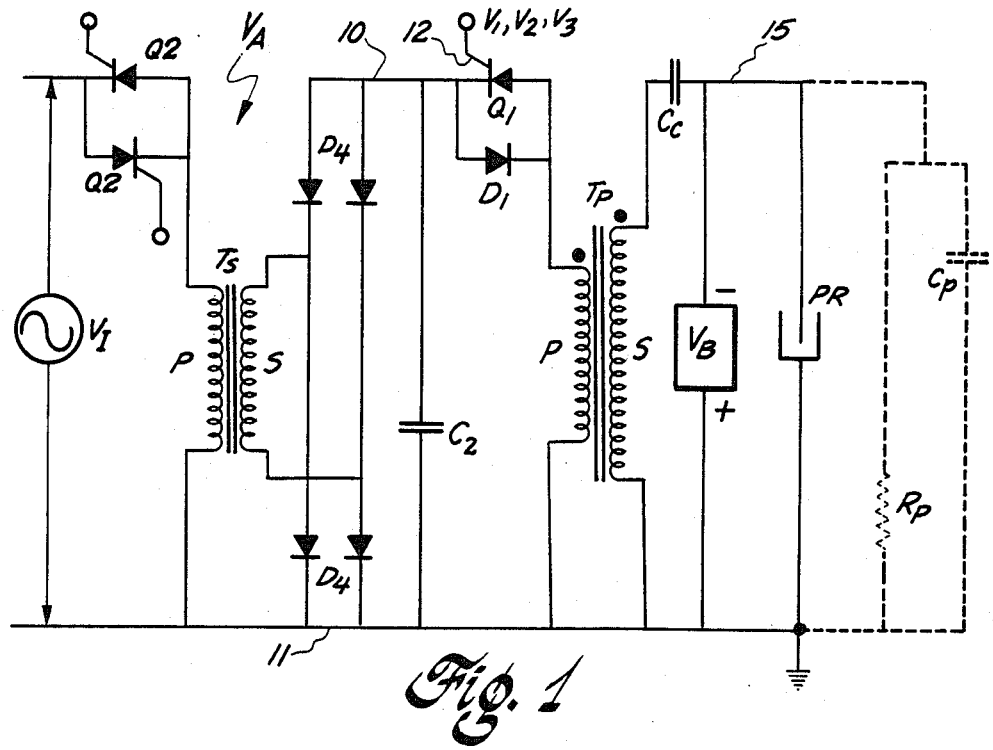
FIG. 1 is a schematic diagram depicting an electrical circuit for a pulse generator which drives a capacitive load, e.g., an electrostatic precipitator with voltage pulses superimposed on a negative d.c. voltage.

A known circuit for providing pulses to an electrostatic precipitator is illustrated in FIG. 1. The circuit includes first and second similar d.c. power supplies $V_A$ and $V_B$. The d.c. supply $V_A$ comprises a conventional transformer-rectifier set coupled to an a.c. supply $V_I$ and includes phase-control switching thyristor $Q_2$ coupled to the primary of a transformer $T_S$. The secondary of transformer $T_S$ is coupled to a rectifier set including diodes $D_4$ in a manner to generate a negative d.c. voltage on conductor 10 with respect to conductor 11. By controlling the application of control signals to the gates of thyristors $Q_2$ in a known manner, the d.c. voltage on line 10 and consequently the charge on capacitor $C_2$ is controlled. A power supply $V_B$ shown in block form, but similar in construction to supply $V_A$ generates a negative d.c. voltage on line 15.

The circuit also includes a capacitor $C_c$ which couples voltage from the secondary S of pulse transformer $T_p$ to an electrostatic precipitator $P_R$ whose internal effective capacitance and resistance are designated in dotted lines as $C_p$ and $R_p$, respectively. Capacitor $C_c$ is charged on positive excursions of the secondary voltage and the voltage on $C_c$ adds to the negative excursions of the secondary voltage. Capacitor $C_c$ also serves to block the d.c. reference supply $V_B$ from entering the pulse transformer $T_p$. On negative excursions of voltage across the secondary transformer $T_p$ the precipitator voltage is increased (in the negative direction) above the reference voltage $V_B$. The value of $V_B$ is usually selected to be at a level below corona onset which is typically less than 40 kilovolts. In this manner, the d.c. voltage supply provides only a minimal power to the precipitator and virtually enables complete control of the power supplied to the precipitator to be effected by controlling the characteristics of the pulses.

It is additionally seen that a thyristor inverter $Q_1$ having a reverse-conducting feedback diode $D_1$ is used to drive the primary winding of pulse transformer $T_p$.

The thyristor $Q_1$ is controlled by the application of pulses to its gate electrode 12. Diode $D_1$ provides a path through which the load current flows during a portion of the pulser cycle when the thyristor is in a substantially non-conductive stage, as will be explained in greater detail hereinafter. In operation, the storage capacitor $C_2$ is charged to a predetermined negative d.c. level via the power supply $V_A$. The storage capacitor $C_2$ stores the energy for generating signals to be applied across the precipitator $P_R$ under the control of control signals $V_1$–$V_3$, FIGS. 2 and 4, supplied to the gate of thyristor $Q_1$.

Figure 2:
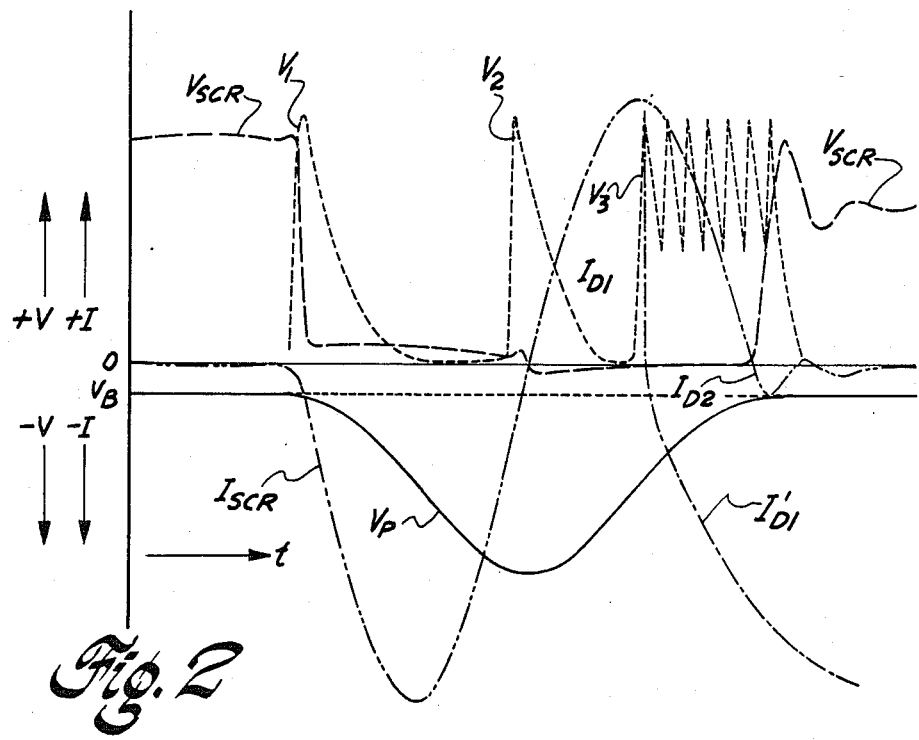
FIG. 2 is a graph of currents and voltages occurring during the operation of the circuit of FIG. 1 in accordance with the teachings of the invention.

Normal operation of the circuit of FIG. 1 can be best understood by reference to FIG. 2. The circuit operates by first charging the storage capacitor $C_2$ to a predetermined negative d.c. voltage level from supply $V_A$. Thereafter, whenever a voltage pulse is to be produced across the precipitator $P_R$, the thyristor $Q_1$ is triggered into conduction by a voltage pulse applied to its control electrode. As the thyristor $Q_1$ is switched into conduction, the voltage $V_{SCR}$ across its terminals drops to near zero as current $I_{SCR}$ through the thyristor rises as shown in FIG. 2. While the thyristor conducts, the voltage $V_P$ across the precipitator $P_R$ increases from the base negative d.c. potential established by d.c. supply $V_B$ to a peak by virtue of the discharge current from storage capacitor $C_2$. Current $I_{SCR}$ through the thyristor takes the form of a negative half sinusoid which is accompanied by an increasing negative voltage $V_P$ across the precipitator. Current through the thyristor eventually falls to zero at the end of the half cycle as the charging portion of the oscillatory cycle is completed. The turn-off or forward recovery time period $t_q$ for the thyristor now begins during which the device is recovering its voltage blocking capability and during which it is particularly prone to damage.

This above noted negative half cycle of current through the thyristor is followed by a half sinusoid of current $I_{D1}$ through the diode $D_1$. Since current through diode $D_1$ is opposite in direction to current through the thyristor, it is shown as a positive-going half cycle. After passing through its peak value, the voltage $V_p$ across the precipitator falls or collapses toward $V_B$ due to the return of charge to the storage capacitor $C_2$ as part of the oscillatory cycle. Concurrently with the fall of voltage $V_p$ across the precipitator toward $V_B$, the thyristor is cut off and current through the shunting diode $D_1$ increases towards its peak value, then decreases to zero at the end of the pulse cycle.

It should be noted that at the end of the pulser cycle and before voltage $V_{SCR}$ across the thyristor returns to a high forward level, current through the diode $D_1$ reverses in direction for a short time. Specifically, for a short time period, which follows the end of the pulser cycle by approximately 5 microseconds, depending on diode characteristics, current through the diode illustrated as $I_{D2}$ in FIG. 2, is in the direction opposite to the normal forward biased direction while the diode is returning to its reverse biased current blocking condition.

The peak of voltage $V_p$ across the precipitator, it should be noted, occurs approximately at the transition point from thyristor current to diode current. Specifically, as current $I_{SCR}$ through the thyristor collapses to zero and before diode conduction begins, the voltage $V_p$ across the precipitator is at its peak or maximum. The sinusoidal nature of the currents flowing through the thyristor and diode are the result of the action of the series oscillatory circuit formed by the storage capacitor $C_2$, the pulse transformer $T_p$, coupling capacitor $C_c$ and precipitator capacitance $C_p$. The presence of diode $D_1$ permits the recovery of pulse energy to storage capacitor $C_2$ during collapsing or falling portions of the voltage pulse across the precipitator. This arrangement is particularly effective in reducing energy costs and in increasing the electrical efficiency of the pulser circuit.

The normal cycle of operating the pulser is brought to termination by the collapse of voltage $V_p$ across the precipitator to $V_B$ with a concurrent collapse of current $I_{D1}$ through diode $D_1$ after which voltage $V_{SCR}$ across the diode returns to a high positive value.

It is significant to note that the normal return of a high forward voltage across the thyristor at the end of the pulser cycle must be recognized as a potential problem if it occurs during a period when the thyristor is in its forward recovery period and, therefore, has not yet fully regained its forward voltage blocking capability. This latter problem, as alluded to hereinbefore, is of particular concern after false retriggering pulses are generated by the sparkover detection circuit and is the subject of concurrently filed, commonly assigned Patent Application Ser. No. 761,458 entitled "False Triggering Protection For Switching Device of a Capacitive Load Pulser Circuit", in the names of the inventors named herein.

While FIG. 1 shows a single switch comprised of thyristor switching element $Q_1$ and diode $D_1$, the switch, in order to advantageously have an increased switching voltage, may be conventionally comprised of several individual thyristors all wired in series. In such an arrangement, a shunting diode is connected in reverse across each thyristor. Also, in such an arrangement, each of the thyristors must be coupled to a firing system for triggering each of them into conduction at the appropriate time. Arrangements for accomplishing gate triggering of a plurality of such series connected switching elements are well known in the art and a suitable firing circuit for series connected SCR's is disclosed in commonly assigned copending application Ser. No. 529,307, filed on Sept. 6, 1983 entitled "Means and Method for Simultaneously Triggering Series SCR's".

In addition, while the thyristor and shunt diode which jointly comprise the switch of the inverter of FIG. 1 are shown as separate devices, an equivalent single package, known as a reverse conducting thyristor or RCT, is commercially available from Brown Boveri and Company and may be substituted into the circuit of FIG. 1.

FIG. 3 shows a circuit in block form for generating the low level control signals to control the firing of the thyristor (or group of thyristors) comprising the switching element of FIG. 1 in accordance with the teachings of the invention. The basic timing for the start of each pulse generation cycle is provided by a pulse generator 30 which may vary between 0 and 300 pulses per second. The pulses from the pulse generator 30 are fed to an OR gate 35 the output of which is coupled to the control signal generator 37, the control signal generator operating to generate a control signal $V_1$ to drive the control gate of the thyristor $Q_1$ or thyristors in the circuit of FIG. 1. Since each pulse from pulse generator 30 passes through OR gate 35 this passage marks the initiation of a new pulser cycle for the precipitator load.

The output of pulse generator 20 also initiates a first timer 60 which provides an output signal a small time period (usually about 5 microsec.) prior to the transition or crossover from thyristor conduction to diode conduction. As explained hereinabove with reference to FIG. 2, this is equivalent to about 5 microsec. prior to occurrence of the peak voltage across the precipitator. In respose to the output from timer 60, a zero pulse timer 62 provides a short control pulse which passes through OR gates 75 and 35 to control the generation of the transition gate trigger $V_2$ in FIG. 2. The output from timer 62 also is fed to an inverting input of AND gate 71 to prevent passage of sparkover retrigger pulses during the time when the transition gate trigger is being generated, as will be explained in more detail below.

The falling edge of the output from the first timer 60, FIG. 4, activates a second timer 41 which provides a high output for the period ending a short time (preferably about 5 microsec.) before the end or termination of the normal pulse cycle in order to inhibit firing of the retriggering circuit due to the rapid positive change of slope caused by the reverse recovery period of diode $D_1$. The output of the second timer 41 is fed to AND gate 43 and operates to enable the passage of sparkover initiated retrigger pulses from sparkover detector 50 during the period the second timer output is high. Thus, retrigger pulses from sparkover detector 50 are allowed to pass through AND gate 43 during the time period that the second timer is high, i.e., from the time the zero transition pulse is generated until a short time period before the end of the pulser cycle.

As alluded to above, the sparkover detector 50 drives the other input to AND gate 43 and includes a current transformer 51 the primary of which is coupled in series with pulse transformer $T_p$ of FIG. 1 in a conventional manner. The secondary of current transformer 51 is coupled to a first slope detector 52 which monitors the rate of change of current through the pulse transformer (and in effect the rate of change of current through the thyristor $Q_1$-diode $D_1$ combination). A second rate of change detector is driven by the output of the slope detector 52. The combined effect of detectors 52 and 53 is to generate a signal out of detector 53 which is proportional to the second derivative of the current through the pulse transformer $T_p$. This signal is amplified at 54 then fed to a threshold detector 55. A signal indicating a sufficiently high rate of change in current through the current transformer 51 produces a high output from the threshold detector 55 which is fed to the AND gate 43. If such a signal occurs during the time the output of the second timer is high, the output of the AND gate 43 sets a timer 70. The output of the diode conduction time 70 is high for a period of time equal to at least the duration of diode conduction during sparkover-free operation of the pulse generator. Ideally, it would be a short time period longer than the diode conduction time.

When the output of timer 70 is high and timer 62 is low (no transition pulse being generated), AND gate 71 provides a high output to initiate the production of pulses from burst pulse generator 72, which pulses pass through OR gates 75 and 35 to generate the sparkover retrigger control sequence illustrated as $V_3$ in FIG. 2. Pulses from burst generator 72 continue to pass to the control signal generator 37 as long as the diode conduction timer 70 remains high. Thus, in response to detection of each sparkover event by sparkover detector 50, a series of pulses are directed to the control signal generator 37 which extend over a time period determined by the diode conduction timer 70. The above arrangement provides protection against damage to the thyristor which may result from false triggering as explained in greater detail hereinafter and which is the subject of the aforementioned concurrently filed, commonly assigned application Ser. No. 761,458.

In operation and with particular reference to the waveforms of FIGS. 2 and 4, the circuit of FIG. 3 operates to provide a succession of pulses which operate to control the generation of gate control signals to the thyristor switch of FIG. 1. The basic rate at which precipitator pulse cycles are initiated is controlled by the rate of pulse generator 30. Each pulse from generator 30 initiates a turn-on pulse $V_1$ from control signal generator 37 which is directed to the gate of thyristor $Q_1$ (or an equivalent series of such devices).

Each pulse from generator 30 also begins the generation of a transition pulse $V_2$ by means of timers 60 and 62, gates 75 and 35, and generator control 37, as explained in detail above.

Spark detector circuit 50 continually monitors load current via an appropriately located current transformer 51 and, in response to a predetermined positive shape exceeding a preselected threshold provides a signal to begin the initiation of a sparkover retrigger pulse sequence $V_3$, FIGS. 2 and 4. This retrigger sequence is inhibited only when the output of the first timer 60 is high, i.e., during the time from the initiation of the pulse cycle until the zero transition pulse $D_2$ is generated. The retrigger sequence $V_3$, FIGS. 2 and 4, is contrasted to the sparkover trigger pulse of short duration suggested in U.S. Pat. No. 4,503,477, takes the form of a series of pulses which extend from the time sparkover is detected to beyond the end of the pulser cycle. By extending beyond the end of the normal, i.e., sparkover-free, cycle false triggering damage to the switching element is averted. For example, referring to FIG. 2, if only a short retrigger pulse were generated in response to a sensed (but false sparkover) the retrigger pulse would not be accompanied by a change in voltage $V_{SCR}$ across the thyristor to a high positive value, thus the thyristor would not be immediately retriggered. However, since a high gate current would have been supplied to the thyristor, a time period $t_q$ would have to pass before the thyristor regained its voltage blocking ability. If during this $t_q$ interval the pulse cycle terminated thereby allowing $V_{SCR}$ to go to a high positive value, (as would occur during normal operation) the thyristor would be exposed to a weak turn-on and potential damage.

In contrast, providing the retrigger control signal in the form of a series of pulses $V_3$ which extend beyond the end of the pulser cycle, the thyristor will, instead, be safely turned on, even in the case of a falsely generated retrigger pulse and damage to the thyristor will be avoided.

The gate triggering control signals should, of course, have a first rise time in order to guarantee a strong turn-on in a minimum possible time. For this reason the exact values for such control signals would depend on the switching element characteristics. However, for thyristor devices generally used in such applications a gate current of at least 8 A peak minimum with a rise time of at least 2 to 3 A/microsec would be appropriate. Such fast rise times are particularly important where simultaneous turn-on of a plurality of series connected thyristors is required.

The gate control signal $V_2$ is initiated prior to the zero current crossover time to ensure its presence at a sufficiently high level at the zero crossover. $V_2$ should be maintained above a safe turn-on level (approximately 1.5 A) for at least a time past zero crossover to guarantee a hard turn-on of the thyristor as a result of any sparkover occurring adjacent the zero crossover. $V_2$ should not terminate until a time after zero crossover when the retrigger sequence $V_3$ can be generated in a sufficient time to protect the switching device. In a system in which the cycle time for the voltage pulse $V_p$ is 70 microseconds the duration of $V_2$ would be approximately 15 microseconds assuming a turn-off time $t_q$ of about 25 microseconds. The control signal $V_2$ should, on the other hand, not persist for a sufficiently long time to permit a weak turn-on at the return of forward voltage across the thyristor at the end of the cycle. Specifically, $V_2$ in worst-case conditions, should not exceed in duration the diode conduction time period minus the duration of the turn-off or forward recovery time period $t_q$.

The control pulse $V_1$ is subject to less stringent requirements since the switching device is not subject to sparkover damage during the time it is applied. For ease of implementation, however, it may be produced by the same circuit which generates $V_2$ and shares common characteristics.

The sparkover retrigger sequence $V_3$ is generated by successively and rapidly retriggering the control signal generator 37 which produces the pulses $V_1$ and $V_2$ in accordance with the above noted specifications. Thus $V_3$ is, in the preferred embodiment, comprised of pulses having upper portions shaped identically as pulses $V_1$ and $V_2$. The pulse burst generator 72 which retriggers the control signal generator is selected to have a pulse period of approximately 15 microseconds in a system of the type described above but this could vary somewhat depending on the particular characteristics of the pulses $V_1$ and $V_2$ and the control signal generator 37.

The use of a long duration sparkover retrigger sequence eliminates the potential damage resulting from false sparkover triggers. The duration of this burst should be slightly longer than the diode conduction half cycle time period and each pulse within the burst should vary ideally between about 8 A maximum and 1.5 A minimum over this time.

While the retrigger sequence $V_3$ has been shown as a series of pulses, it is also possible to use a single long duration pulse instead. However, such an arrangement would place a large burden on the capability of the control signal generator required to supply such relatively high currents at high voltage potentials through high frequency pulse transformers over the required period.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. In a circuit for generating a voltage pulse across a load, the load voltage pulse being characterized by a period of rising voltage followed by a period of falling voltage, said periods separated by a transition period, said circuit comprising a switching element having a control electrode which serves to initiate heavy current conduction through the element in response to a control pulse, said current falling to zero during said transition period, current being thereafter shunted around said element during said period of falling load voltage, an improved means for protecting said element from damage due to sparkover occurring in said load comprising means for applying a first control pulse to said control electrode to initiate said load voltage pulse and means for applying a second control pulse during the occurrence of each said transition period to said control electrode to render said element substantially conductive within said transition period.

2. The combination recited in claim 1 further including an oscillatory circuit coupled to said element and timer means for generating said second pulse at a preselected time after the occurrence of said first pulse based upon the characteristics of said oscillatory circuit.

3. The combination recited in claim 2 wherein said element comprises a thyristor switch shunted by a diode, said diode operating to shunt current around said thyristor during the period said load voltage pulse is falling.

4. The combination recited in claim 1 wherein second control pulse is generated independently of the occurrence of sparkover.

5. The combination recited in claim 4 wherein said second pulse is generated independently of detection of said transition period.

6. The combination recited in claim 1 wherein said load is an electrostatic precipitator.

7. The combination recited in claim 6 wherein said switching element is a thyristor and said control pulse is applied to the gate electrode of said thyristor.

8. In a method for generating a voltage pulse across a reactive load by means of currents generated by an oscillatory circuit under the control of a gated switching element, said voltage pulse characterized by a first period during which voltage rises across said load and a second period during which voltage falls across said load, said currents further characterized by a first half cycle during which said current flows through said switching element in a first direction concurrent with said first period and a second half cycle during which current flows through said switching element in an opposite direction concurrent with said second period, and wherein said voltage pulse is initiated by application of a first control pulse to said switching element to render it substantially conductive the improved step for eliminating damage to said switching element as a result of sparkover occurring in said load comprising: applying a second control pulse to said switching element to render said element substantially conductive concurrent with each transition between said first and second half cycles.

9. The method of claim 8 wherein the step of applying said second control pulse to said switching element concurrent with said transition is accomplished independently of detecting said sparkover.

10. The method of claim 8 wherein the step of applying said second control pulse to said switching element is accomplished independently of actual detection of said transition.

11. The method of claim 8 wherein the step of applying said second control pulse is accomplished by generating said second control pulses a preselected time after occurrence of said first control pulse.

12. The method of claim 8 wherein said steps of applying said first and second control pulses comprises applying said control pulses to the gate electrode of a thyristor switching element.

13. The combination comprising:
an electronic switch including a semiconductor switching element and a diode shunted thereacross,
an electrical load coupled to said switch,
means, including said load, in circuit with said switch for causing current through said element in normal operation to successively rise in a first direction to a peak value, fall to zero and thereafter to cause current through said diode to rise in a direction opposite to said first direction to a peak value and fall to zero, the period of operation adjacent the crossover from switching element current to diode current defining a transition period, and
means for momentarily rendering said element substantially conductive during each said transition period.

14. The combination recited in claim 13 wherein said element includes a switching control electrode and said means for rendering said element conductive comprises means for applying a voltage pulse to said control electrode during said transition period.

15. The combination recited in claim 13 wherein said load is capacitive.

16. The combination recited in claim 15 wherein said load is an electrostatic precipitator.

17. The combination recited in claim 15 further including sensing means responsive to a sparkover in said load for momentarily rendering said element substantially conductive.

18. The combination recited in claim 17 wherein said sensing means includes a transformer having a primary winding in series with said switch for monitoring the rate of change of current through said switch.

19. The combination recited in claim 13 wherein said means for causing current comprises means for generating a first voltage pulse for application to said element and wherein said means for momentarily rendering includes timing means for measuring the passage of a preselective time after the occurrence of said first voltage pulse.

* * * * *